(12) United States Patent
Suzuki et al.

(10) Patent No.: US 6,702,609 B2
(45) Date of Patent: Mar. 9, 2004

(54) IC SOCKET CONTACT MEDIUM HAVING UNIFORM CONTACT FORCE

(75) Inventors: Katsumi Suzuki, Tokyo (JP); Yuji Nakamura, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/212,873

(22) Filed: Aug. 7, 2002

(65) Prior Publication Data

US 2003/0032326 A1 Feb. 13, 2003

(30) Foreign Application Priority Data

Aug. 9, 2001 (JP) ........................... 2001-242468
Aug. 2, 2002 (JP) ........................... 2002-226654

(51) Int. Cl.[7] .......................... H05K 1/00; H05K 7/00
(52) U.S. Cl. .......................... 439/525; 361/820
(58) Field of Search .................. 439/525, 527, 439/66, 69, 70, 330; 361/820; 324/754

(56) References Cited

U.S. PATENT DOCUMENTS 6,299,460 B1 * 10/2001 Haselby et al. ............... 439/67
2002/0016097 A1 * 2/2002 Parkinson et al. ............ 439/89

FOREIGN PATENT DOCUMENTS

JP 10-050440 2/1998
JP 2001-185259 7/2001

* cited by examiner

*Primary Examiner*—Chandrika Prasad
(74) *Attorney, Agent, or Firm*—Finnegan, Henderson, Farabow, Garrett & Dunner, L.L.P.

(57) ABSTRACT

An IC socket is provided which realizes a uniform pressure of contact with an IC package over the entire length of a row of contacts and thereby enables an appropriate evaluation of characteristics of the IC package. The IC socket mounted on a printed circuit board includes: a socket base having a large number of contacts arranged in a row and brought into contact with leads of an IC package; a cover bearing on the contacts through an elastic body; and fixing portions for securing the cover to the socket base; wherein a contact surface between the elastic body and the contacts is curved in a longitudinal direction and the curved surface is so shaped as to generate a uniform contact force between the contacts and the leads of the IC package.

11 Claims, 10 Drawing Sheets

IC SOCKET CONTACT MEDIUM HAVING UNIFORM CONTACT FORCE

This application is based on Japanese Patent Application No. 2001-242468 filed Aug. 9, 2001 and No. 2002-226654 filed Aug. 2, 2002 the content of which are incorporated hereinto by reference.

BACKGROUND OF THE INVENTION

1. Field of the Invention

The present invention relates to an IC socket that functions as a contact medium between an IC package and a printed circuit board and more specifically to a technology for connecting leads of the IC package to corresponding terminals of the printed circuit board for effective evaluation of characteristics of the IC package.

2. Description of the Prior Art

As operation signal frequencies of integrated circuits have been increasing in recent years, a variety of kinds of IC sockets have been developed which have contacts with low inductance. In the IC sockets with reduced inductance and improved radio frequency characteristics, it is necessary to shorten the length of signal lines of the socket contacts as much as possible. At the same time, the contacts need to have a structure that allows them to elastically contact the leads of the IC package with some pressure. However, for contacts of a type that is formed with a spring portion when the contact is punched out of a metal plate material, the pressure contact characteristic imposes a limit on the reduction in the length of the spring portion, i.e., signal line length. It is therefore difficult with this type of contacts to achieve a required reduction in inductance.

To overcome this problem, Japanese Patent Application Laid-open No. 10-050440 (1998) (Japanese Patent Application No. 8-204994 (1996)) proposes an IC socket in which an elastic body is interposed between a socket cover and contacts, which are to contact the leads of an IC package, to hold the contacts in a standby posture and in which an elastic recovery force of the elastic body is utilized to produce a contact pressure between the contacts and the IC leads.

With the above IC socket, however, since an elastic body is interposed between the contacts and the cover and there are scattered fixing portions for fixing a socket base and the cover, the contact pressures near the fixing portions tend to become higher than those of other portions. As a result, the contact pressure produced between the contacts of the IC socket and the IC package leads are not uniform over the entire length of a row of contacts, leaving a possibility of a part of the contacts failing to contact the IC package. This poses a problem in establishing a condition for an appropriate contact pressure.

With a view to overcoming this problem experienced with conventional IC sockets, it is an object of the present invention to provide an IC socket that can realize a uniform contact pressure between the contacts and the IC package over the entire contacts, thus allowing an appropriate evaluation of characteristics of an IC package being tested.

SUMMARY OF THE INVENTION

To solve the problem described above, an IC socket of the present invention mounted on a printed circuit board comprises: a socket base having a large number of contacts arranged in a row and brought into contact with leads of an IC package; a cover bearing on the contacts through an elastic body; and fixing portions for securing the cover to the socket base; wherein a contact surface between the elastic body and the contacts is curved in a longitudinal direction and the curved surface is so shaped as to generate a uniform contact force between the contacts and the leads of the IC package.

The curved surface may be formed according to a predetermined contact force distribution curve.

Further, the contact force distribution curve can be obtained by simultaneously displacing all of a number of contacts arranged in a row a predetermined distance and measuring a contact force of each contact successively.

The contact surface of the cover with the elastic body may be formed into the shape of the curved surface.

The elastic body may have its contact surface with the cover formed planar and its contact surface with the contacts formed into the shape of the curved surface.

The elastic body may be rubber.

Further, the elastic body may be a hollow tube.

Here, the contacts each have a first contact portion protruding inwardly of the IC socket and adapted to contact one of the leads of the IC package; a second contact portion pivotally supporting the contact and adapted to contact one of interconnect lines on the printed circuit board; and a pressure portion adapted to press the elastic body as the contact is pivoted.

The first contact portion, the second contact portion and the pressure portion may be integrally formed.

With this invention, a non-uniform pressing force that varies in magnitude depending on the positions of the fixing portions and which is applied to the contacts through the elastic body can be eliminated by shaping the socket cover in conformity with the contact force distribution curve. It is thus possible to provide an IC socket capable of producing a uniform pressing force in the contacts and thereby enable an appropriate evaluation of characteristics of the IC package.

The above and other objects, effects, features and advantages of the present invention will become more apparent from the following description of embodiments thereof taken in conjunction with the accompanying drawings.

DETAILED DESCRIPTION OF PREFERRED EMBODIMENT

An embodiment of the present invention will be described in detail by referring to the accompanying drawings.

What is detailed in the following is only one example of the invention and is not intended in any way to limit a technical range of application of this invention.
(Embodiment)

An IC socket of this invention will be described by referring to FIGS. 1 to 5.

Figure 1:
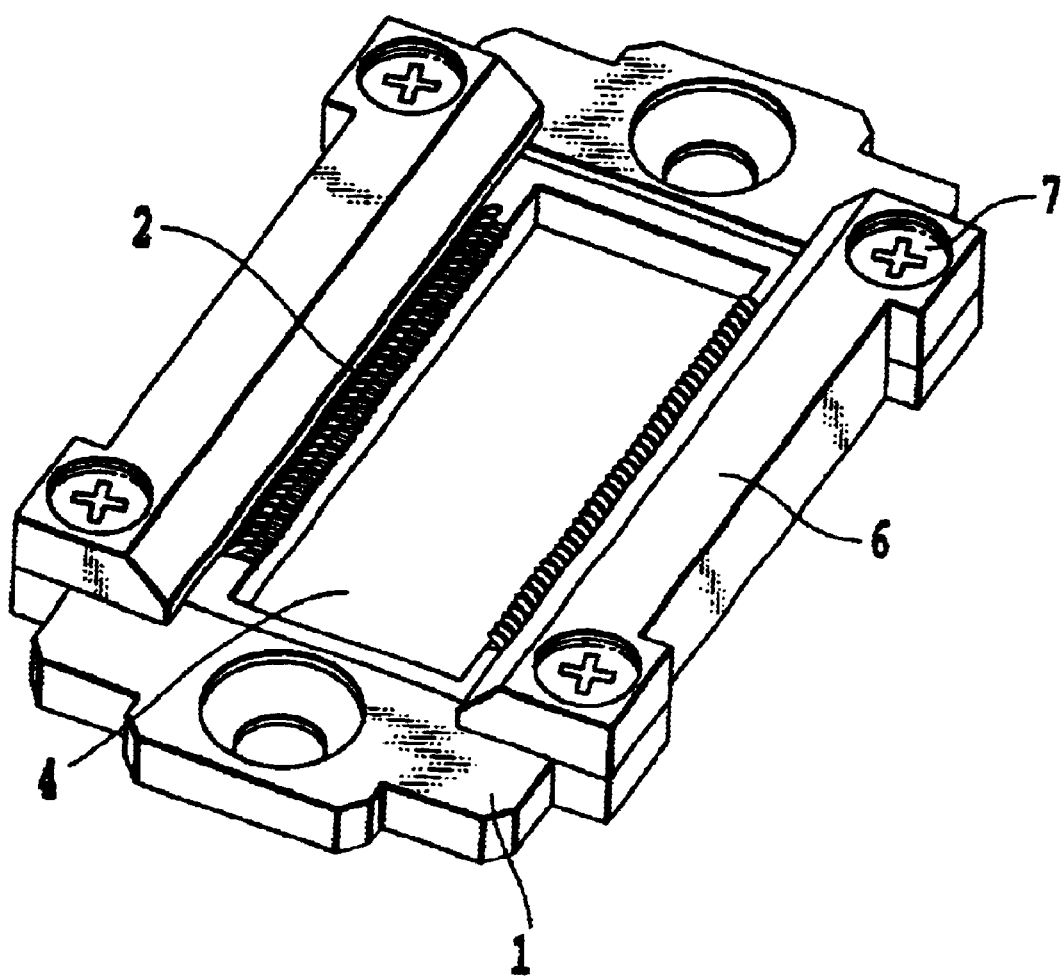
FIG. 1 is a perspective view of an assembled IC socket of the present invention.
Figure 2:
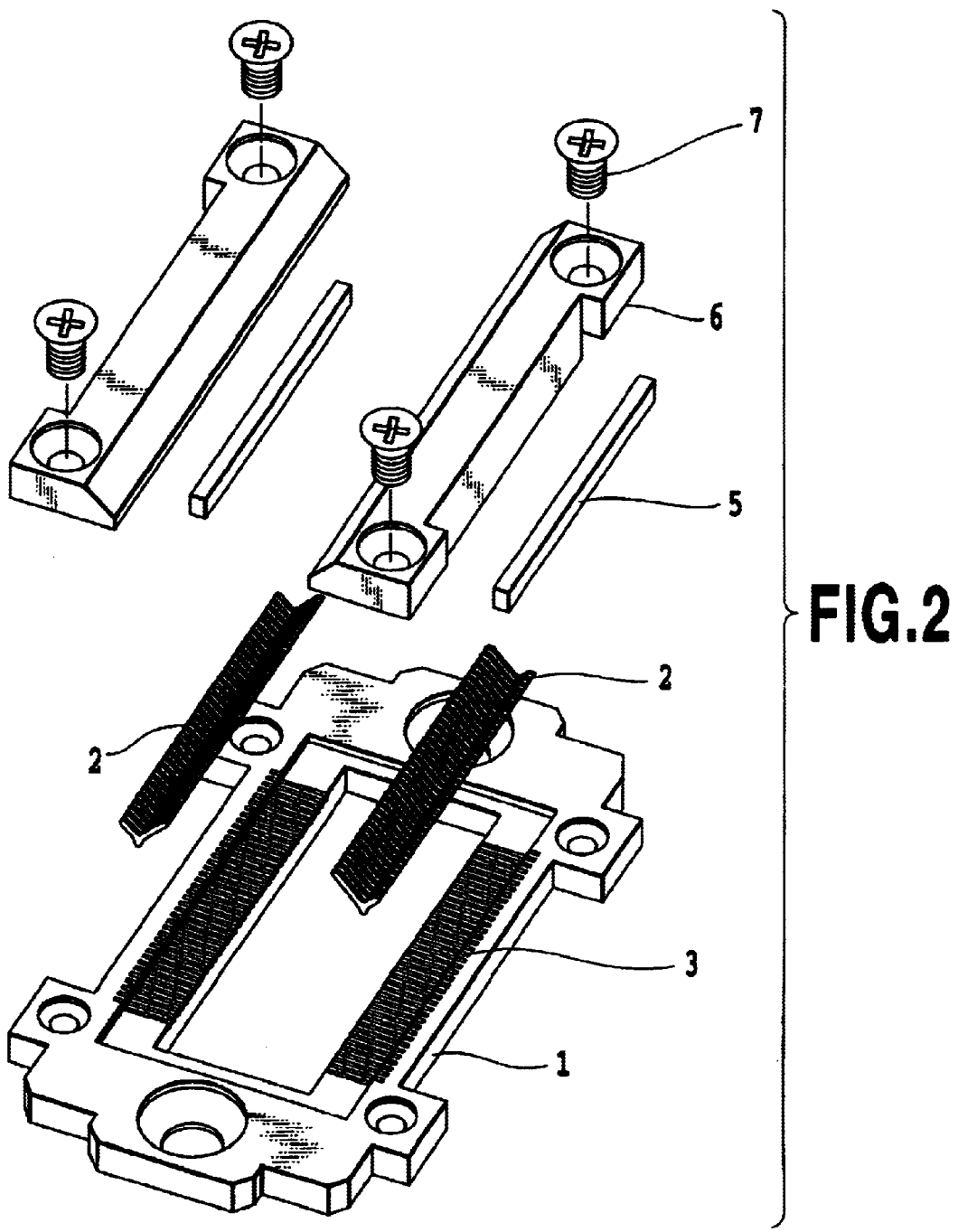
FIG. 2 is an exploded perspective view of the IC socket of the present invention.
Figure 3A:
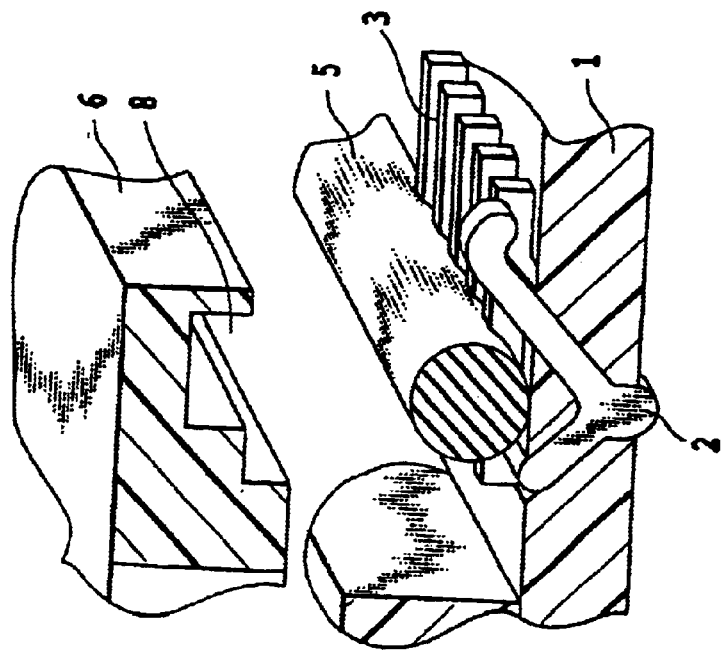
FIG. 3A is a perspective view of a detail portion of the IC socket of the present invention showing and additional embodiment of an arrangement of a socket cover and an elastic body.
Figure 3:
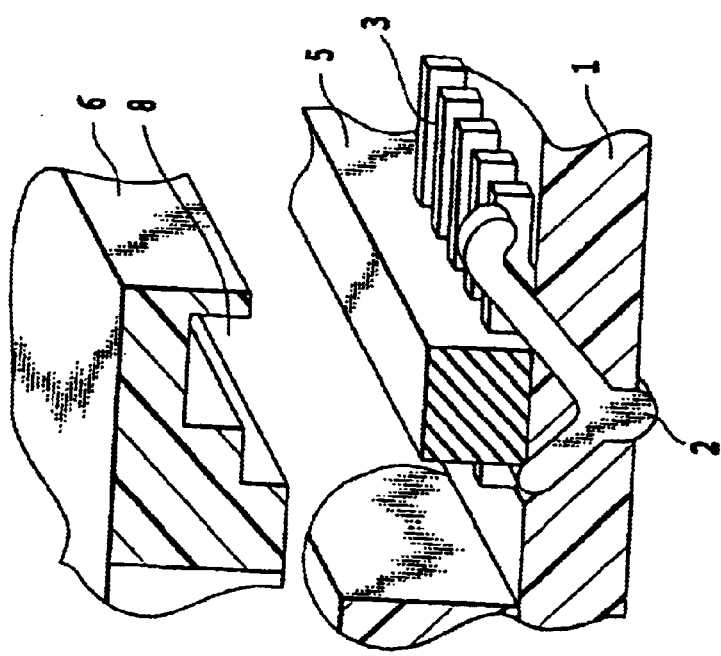
FIG. 3 is a perspective view of a detail portion of the IC socket of the present invention showing an arrangement of a socket cover and an elastic body.

As shown in FIG. 1 and FIG. 2, the IC socket is made of an insulating material and has an almost square socket base 1 with an IC accommodating portion 4 formed at the center thereof and a large number of contacts 2 arranged in two rows along longitudinal opposing sides of the IC accommodating portion 4. Between each of the contacts 2 is interposed an insulating separation wall 3 that is provided on the socket base 1. Over the contacts 2 are arranged socket covers 6 extending in the direction of rows of the contacts 2, with an elastic body 5 disposed between each socket cover 6 and the corresponding row of the contacts 2. The socket covers 6 are secured to the socket base 1 with screws 7. This is explained in more detail. As shown in FIG. 3, an underside of each socket cover 6 is formed with a longitudinally extending mounting groove 8 in which to hold an upper portion of the elastic body 5. The two socket covers 6 are then rigidly mounted to the socket base 1 so that they extend along the sides of the IC accommodating portion 4. With this arrangement the contacts 2 are supported by the elastic bodies 5 extending longitudinally along and protruding from the underside of the socket cover 6. The elastic body 5 may, for example, be formed of a rubber piece or an air tube or liquid tube circular in cross section as shown in FIG. 3A.

Figure 4A:
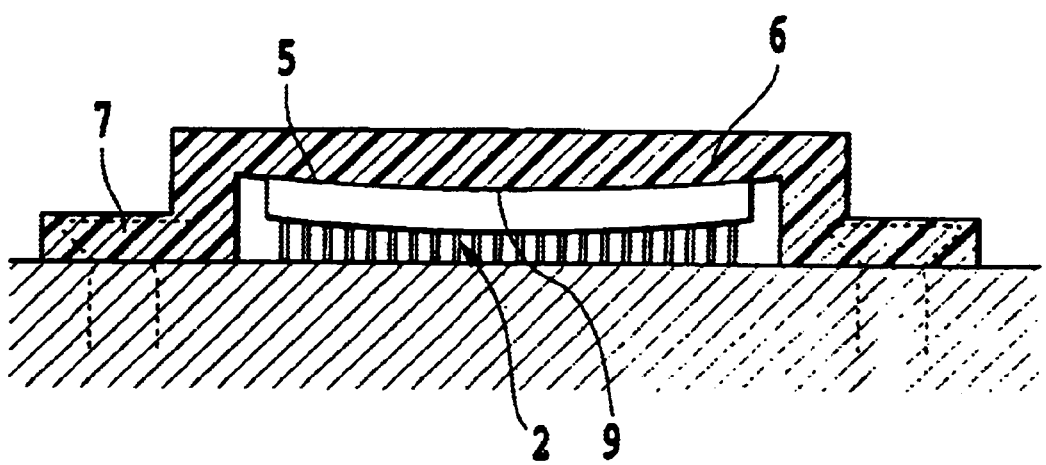
FIG. 4A is a cross-sectional view of a shape of the IC socket of the present invention showing a contour of a contact surface between a socket cover and an elastic body along its longitudinal cross section matches the contact force distribution curve.
Figure 4B:
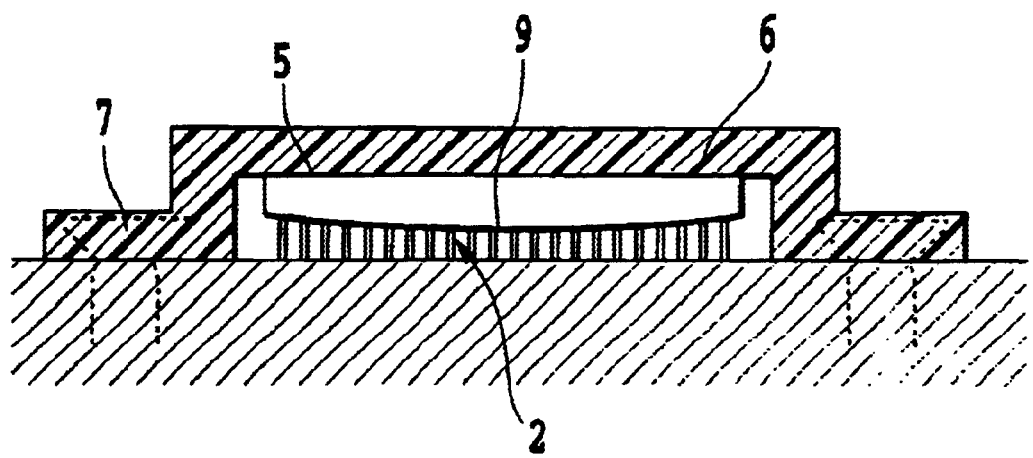
FIG. 4B is a cross-sectional view of a shape of the IC socket of the present invention showing a contour of a contact surface between an elastic body and contacts along its longitudinal cross section matches the contact force distribution curve.

Further, as shown in FIGS. 4A and 4B, each of the socket covers 6 has its contact surface with the elastic body 5 adjusted in dimension at each contact position along a longitudinal cross section to minimize variations in the contact force. That is, the contact surface is so curved that the contact forces generated between the contacts 2 and leads 21 of an IC package 20 are uniform over the entire row of the contacts. For example, as shown in FIG. 4A, the contact surface of the socket cover 6 may have a curved surface 9 with its contour matching the distribution curve of contact forces generated in the contacts which is determined by a method described later.

This curved surface does not necessarily have to be formed on the cover body, and the only requirement is that a contour of a contact surface between the elastic body and the contacts along its longitudinal cross section matches the contact force distribution curve. For example, as shown in FIG. 4B, the contact surface between the cover and the elastic body may be formed flat and the contact surface between the elastic body and the contacts may be contoured to match the contact force distribution curve.

Figure 5:
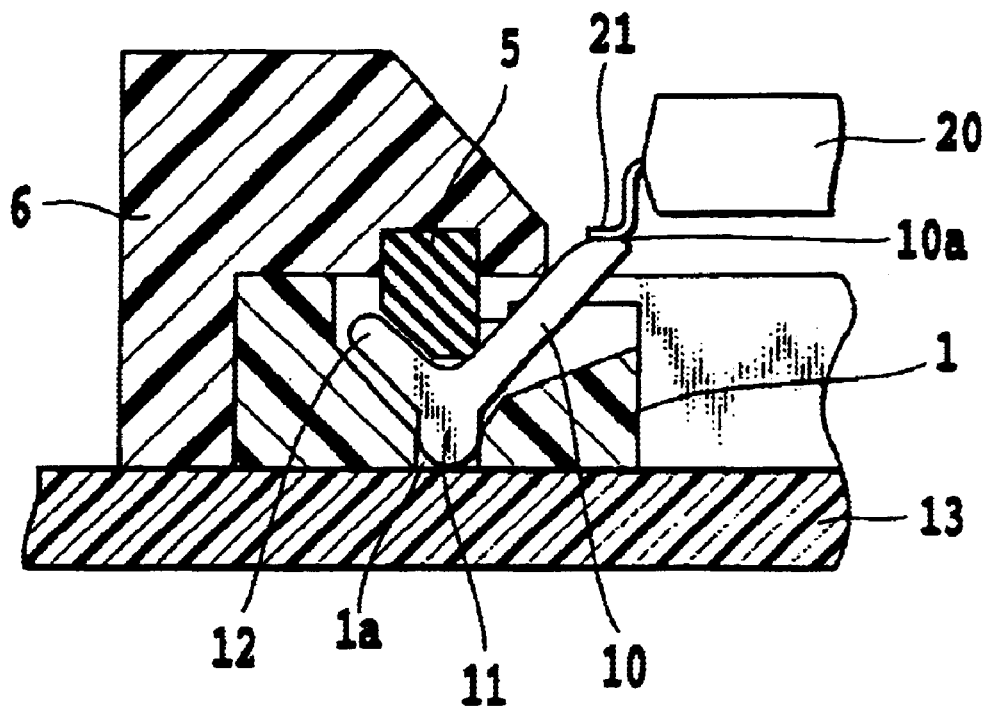
FIG. 5 is a cross-sectional view showing a construction of one of contacts of the IC socket of the present invention.

Further, each of the contacts 2, as shown in FIG. 5, has an upper-end contact portion 10a, or a first contact portion, on which the corresponding lead 21 of the IC package is placed, a contact arm 10 forwardly inclined toward the inside of the IC socket, and a lower-end contact portion 11, or a second contact portion, that contacts a corresponding interconnect line on a printed circuit board 13 via a through-hole 1a formed in the socket base 1. Further, the contact 2 also has a pressing piece 12 that protrudes backwardly of the contact arm 10 from near a connecting portion between the lower-end contact portion 11 and the contact arm 10. The contact arm 10, the lower-end contact portion 11 and the pressing piece 12 are integrally punched out of one and the same metal material to form a rigid contact 2. The contact 2 is vertically movable along the through-hole 1a and also pivotable back and forth about the lower-end contact portion 11 as a fulcrum.

In the IC socket constructed as above and mounted on the printed circuit board 13, when the IC package 20 is put on the contact arms 10 of the contacts 2 with a predetermined pressure, a non-uniform pressing force that varies in magnitude depending on the positions of the fixing portions 7 is superimposed through the elastic bodies 5 on a uniform pressing force that bears on the contacts 2 through the elastic bodies 5. However, since the superimposed pressing force is canceled by the curved surface 9 of the socket cover 6 that holds the elastic bodies 5, only the uniform pressing force is generated in the contacts 2.

Next, a method of determining the contact force distribution curve will be described with reference to FIG. 6.

Figure 6:
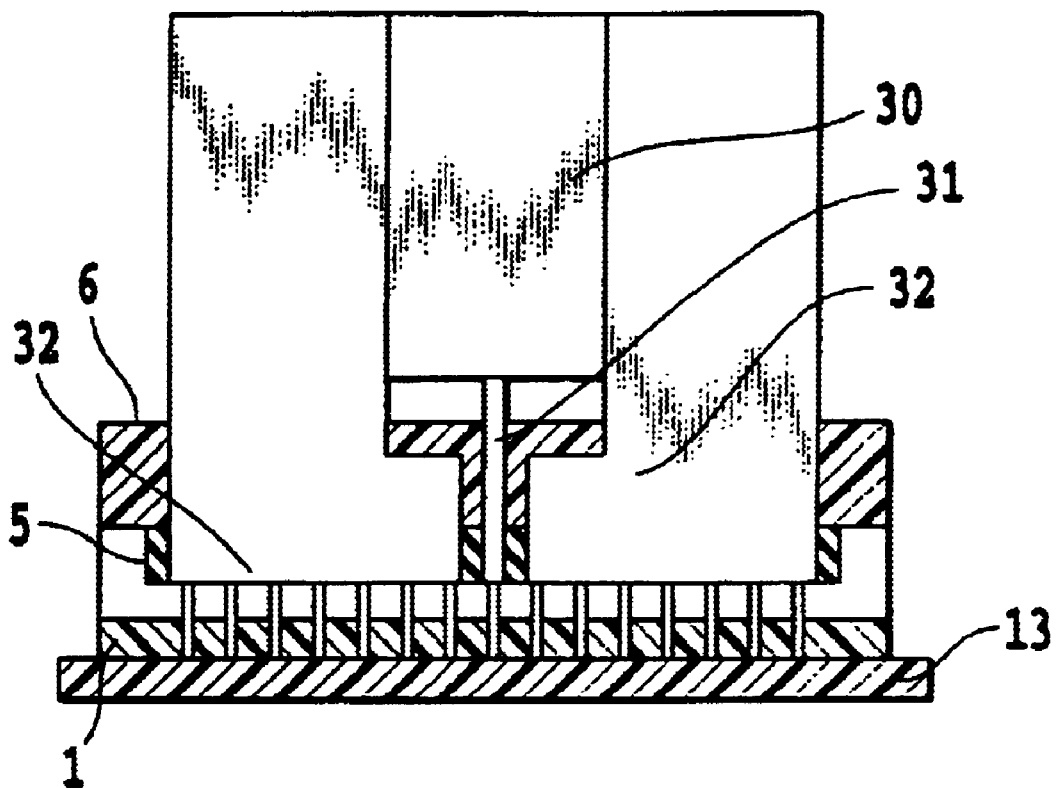
FIG. 6 is a cross-sectional view showing a measuring jig for determining a contact force distribution curve of the IC socket of the present invention.

FIG. 6 shows the construction of an contact force measuring jig, which comprises a load cell 30, a press jig 31 arranged on the underside of the load cell, and press jigs 32 symmetrically arranged on both sides of the load cell 30. In an unloaded state, the contact surfaces of the press jig 31 and the press jigs 32 with the contacts 2 are aligned.

Figure 7A:
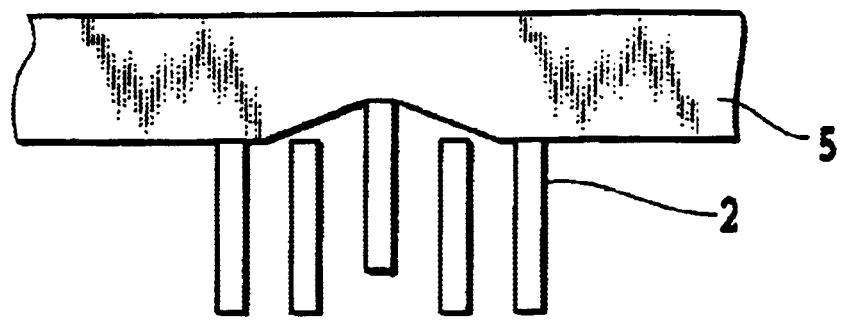
FIG. 7A is schematic diagrams of elastic bodies showing an elastic body when only one contact is displaced.
Figure 7B:
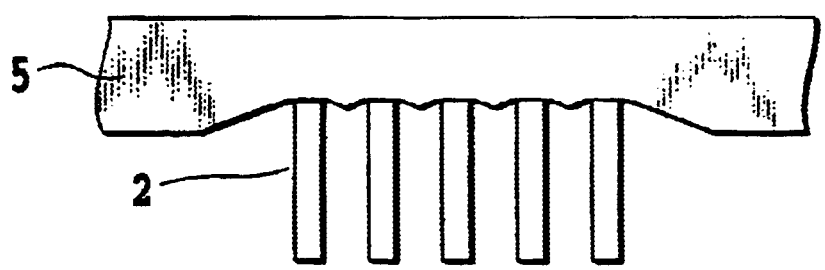
FIG. 7B is schematic diagrams of elastic bodies showing an elastic body when an entire row of contacts is displaced.

Using this contact force measuring jig, the contact force of each of the contacts is measured successively by displacing all the contacts in one row a predetermined distance simultaneously. Here, FIG. 7A represents a schematic diagram showing a state of the elastic body when only one contact is displaced. FIG. 7B represents a schematic diagram showing a state of the elastic body when all contacts in one row are displaced. As shown in FIGS. 7A and 7B, when the entire row of the contacts is displaced in measuring the contact force of each contact, the compressed volume of the elastic body per each contact is smaller than when only one of the contacts is displaced for the measurement, thus making it possible to measure the contact force in a more realistic condition.

Figure 8A:
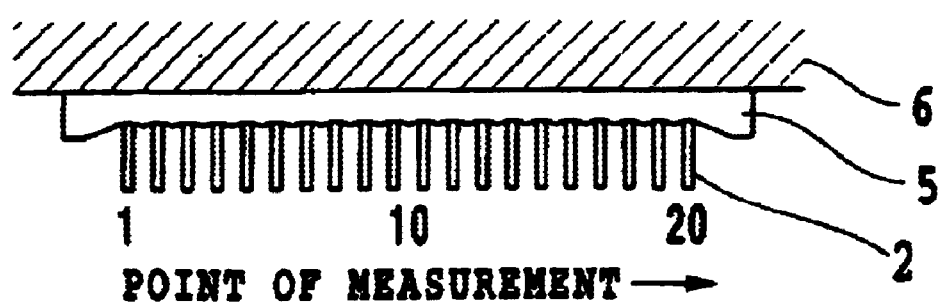
FIG. 8A is contact force distribution curve diagrams representing a distribution curve of contact forces produced in the contacts when the socket cover is formed flat.
Figure 8A:
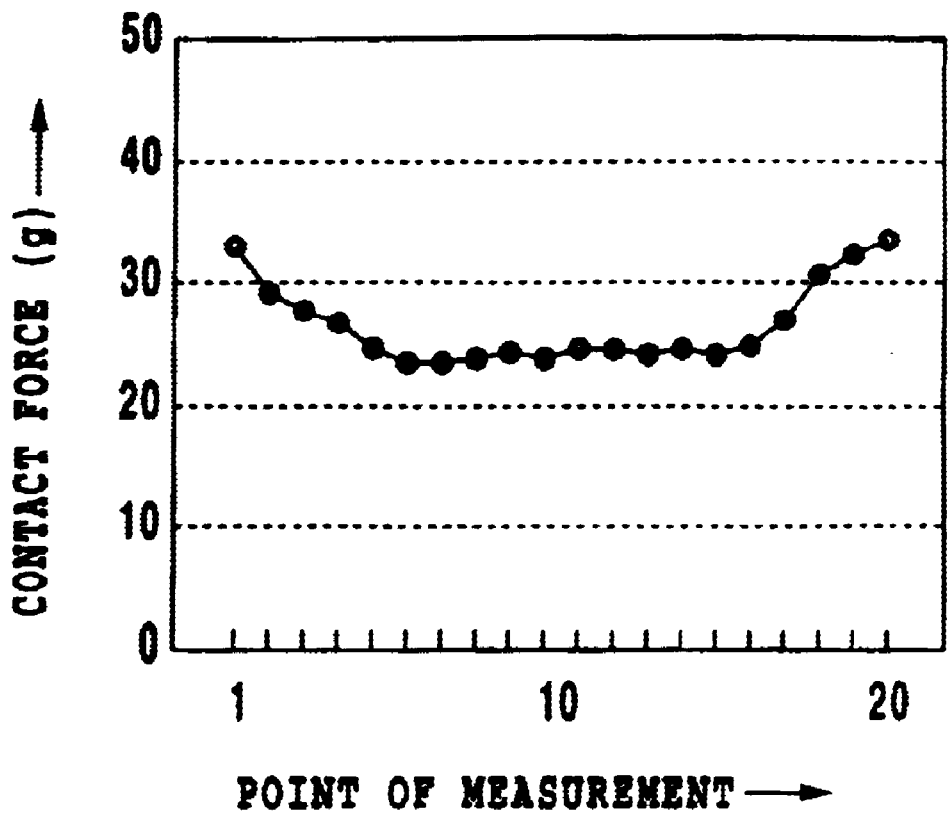
Figure 8B:
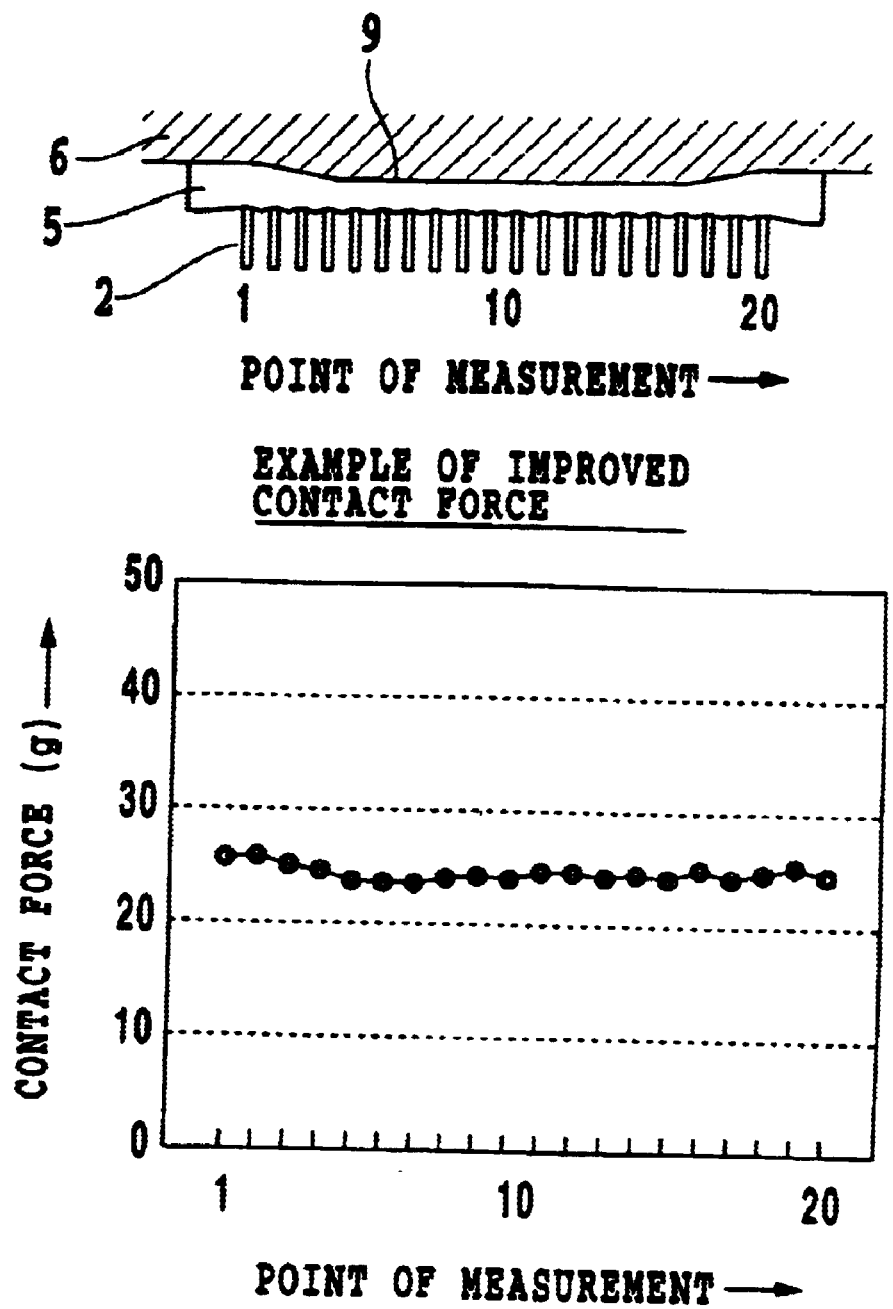
FIG. 8B is contact force distribution curve diagrams representing a distribution curve of contact forces produced in the contacts when the socket cover has a curved shape.

FIGS. 8A and 8B show contact force measurements obtained by the contact force measuring jig described above. FIG. 8A represents measurements when the contact surface between the socket cover 6 and the elastic body 5 is planar and FIG. 8B represents measurements when the contact surface is a curved surface 9 which is contoured to match the distribution curve of the contact force generated in the contacts 2. In FIG. 8A, it can be seen that the contact force is high at both ends of the row of the contacts near the fixing portions 7, whereas in FIG. 8B the non-uniform contact force described above is shown to be made almost uniform by changing the shape of the cover.

By forming the contact surface between the cover 6 and the elastic body 5 in such a way that its contour matches the distribution curve of the measured contact force, an IC socket can be provided which generates a uniform contact force over the entire row of the contacts 2.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. An IC socket mounted on a printed circuit board comprising:

a socket base having a plurality of contacts arranged in a row and connectable with leads of an IC package;

a cover bearing on the contacts through an elastic body to establish a resilient contact force for each contact; and fixing portions for securing the cover to the socket base;

wherein a contact surface between the elastic body and the contacts is curved in a longitudinal direction and the curved surface is so shaped as to generate a uniform contact force between the contacts and the leads of the IC package.

2. An IC socket according to claim 1, wherein the curved surface is formed according to a predetermined contact force distribution curve.

3. An IC socket according to claim 2, wherein the contact force distribution curve is obtained by simultaneously displacing all of a number of contacts arranged in a row a predetermined distance and measuring a contact force of each contact successively.

4. An IC socket according to claim 2, wherein the contact surface of the cover with the elastic body is formed into the shape of the curved surface.

5. An IC socket according to claim 2, wherein a contact surface of the elastic body with the cover is formed planar and the contact surface of the elastic body with the contacts is formed into the shape of the curved surface.

6. An IC socket according to claim 1, wherein the elastic body is rubber.

7. An IC socket according to claim 6, wherein the elastic body is shaped like a tube in cross section.

8. An IC socket according to claim 1, wherein the contacts each have a first contact portion protruding inwardly of the IC socket and adapted to contact one of the leads of the IC package;

a second contact portion pivotally supporting the contact and adapted to contact one of interconnect lines on the printed circuit board; and a pressure portion adapted to press the elastic body as the contact is pivoted.

9. An IC socket according to claim 8, wherein the first contact portion, the second contact portion and the pressure portion are integrally formed.

10. An IC socket mounted on a printed circuit board comprising:

a socket base having a plurality of contacts arranged in a row and each contact positionable a uniform distance from and having a first portion that is directly connectable with leads of an IC package and a second portion that is not directly connectable with said leads;

a cover bearing on the contacts through an elastic body; and fixing portions for securing the cover to the socket base;

wherein a contact surface between the elastic body and the contacts is curved to exert a resilient interface between said second portion of each contact and the elastic body so that the resilient interface causes the contact force between each of the contacts and the respective leads of the IC package to be uniform.

11. An IC socket mounted on a printed circuit board comprising:

a socket base having a plurality of contacts arranged in a row and connectable with leads of an IC package;

a cover having a contact surface formed in the shape of the curved surface, the cover bearing on the contacts through an elastic body contacting the contact surface to apply a resilient contact force for each contact; and fixing portions for securing the cover to the socket base;

wherein a non-uniform pressing force caused by the fixing portions is canceled by the contact surface of the cover; and wherein a contact surface between the elastic body and the contacts is curved in a longitudinal direction and the curved surface is so shaped as to generate a uniform contact force between the contacts and the leads of the IC package.

* * * * *